United States Patent [19]

Meyer, IV et al.

[11] Patent Number: 5,725,050
[45] Date of Patent: Mar. 10, 1998

[54] INTEGRATED CIRCUIT WITH TAPED HEAT PIPE

[75] Inventors: George A. Meyer, IV, Conestoga; Jerome E. Toth, Hatboro, both of Pa.

[73] Assignee: Thermal Corp., Georgetown, Del.

[21] Appl. No.: 706,882

[22] Filed: Sep. 3, 1996

[51] Int. Cl.[6] ............................................. F28D 15/00
[52] U.S. Cl. .................. 165/104.33; 361/704; 257/719; 257/727
[58] Field of Search ........................ 165/104.33, 46, 165/80.1; 361/700, 704, 707, 708; 257/715, 718, 727, 719

[56] References Cited

U.S. PATENT DOCUMENTS

| | | | |
|---|---|---|---|
| 4,204,246 | 5/1980 | Arii et al. | 165/104.33 |
| 4,648,008 | 3/1987 | Neyroud et al. | 257/719 |
| 4,997,032 | 3/1991 | Danielson et al. | 165/46 |
| 5,095,404 | 3/1992 | Chao | 165/104.33 |
| 5,216,580 | 6/1993 | Davidson et al. | 165/104.33 X |
| 5,329,426 | 7/1994 | Villani | 257/719 X |
| 5,331,510 | 7/1994 | Ouchi et al. | 165/104.33 X |
| 5,339,214 | 8/1994 | Nelson | 165/104.33 X |
| 5,343,358 | 8/1994 | Hilbrink | 165/104.33 |
| 5,343,940 | 9/1994 | Jean | 257/713 |
| 5,387,815 | 2/1995 | Nishiguchi | 257/713 |
| 5,396,403 | 3/1995 | Patel | 257/713 |
| 5,424,918 | 6/1995 | Felps et al. | 257/719 X |
| 5,459,352 | 10/1995 | Layton et al. | 257/713 |
| 5,485,671 | 1/1996 | Larson et al. | 165/104.33 X |
| 5,560,423 | 10/1996 | Larson et al. | 257/719 X |

*Primary Examiner*—John Rivell
*Assistant Examiner*—Christopher Atkinson
*Attorney, Agent, or Firm*—Martin Fruitman

[57] ABSTRACT

The invention is an apparatus for attaching a heat pipe to an integrated circuit or other surface. The heat pipe is held against the flat surface by a heat conducting clamp constructed as a "U" cross section with flanges on the ends of the "U" section, and both the heat pipe and the clamp are held onto the integrated circuit or other surface with heat conductive tape which has adhesive on both its faces. The heat pipe itself can be deformed so that its contact surface also is flat and yields better heat transfer with the integrated circuit.

6 Claims, 1 Drawing Sheet

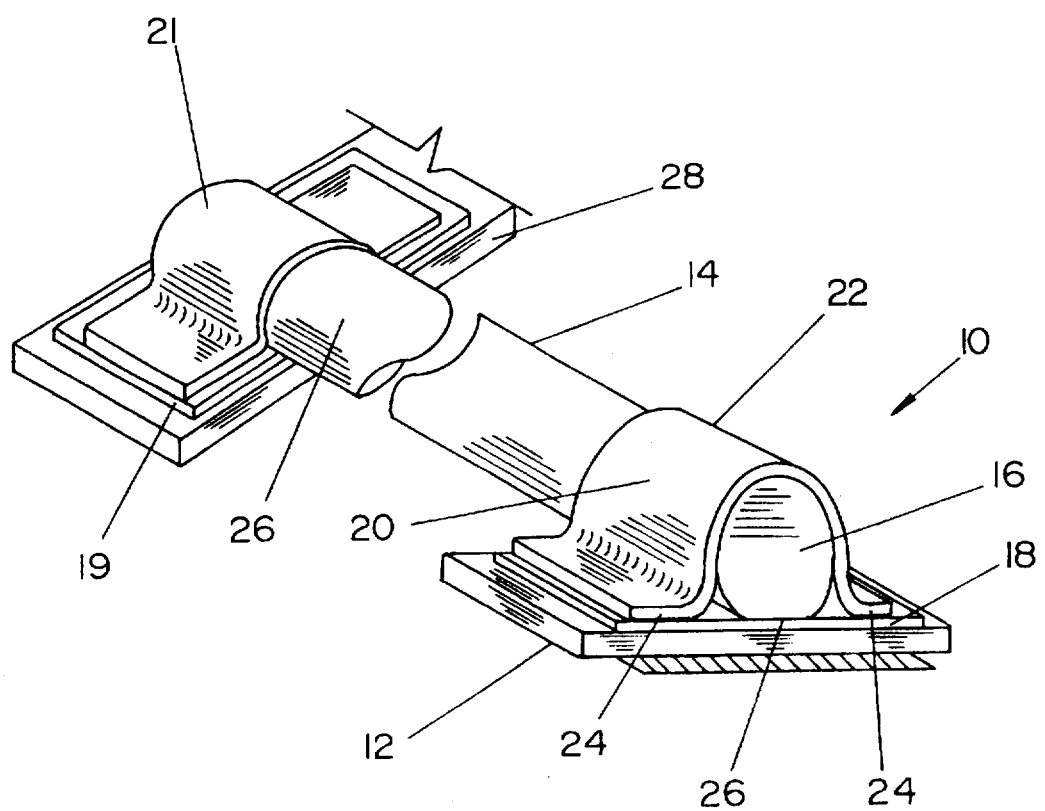

INTEGRATED CIRCUIT WITH TAPED HEAT PIPE

BACKGROUND OF THE INVENTION

This invention relates generally to active solid state devices, and more specifically to a heat sink for an integrated circuit chip which uses a heat pipe and has the heat dissipator pressed against the integrated circuit. With the advent of high speed integrated circuits for computers, the cooling of integrated circuit chips has become both more critical and more difficult. Even desk top computers which are connected to electrical power lines and have comparatively unlimited space and power to locate and operate fans for cooling, are experiencing problems with fan noise and heat dissipation from the new, higher power integrated circuits, and they do not have the severe weight restrictions of the portable computers. Portable computers, the so called lap top computers, are more restricted in space, power, and weight, and such restrictions also create problems in cooling the critical integrated circuits and disposing of the generated heat. At the same time, the power dissipated by individual integrated circuits has significantly increased, so that the problems involved in removing heat have also increased.

The basic problem is that the heat is generated on the relatively small surface of the integrated circuit deep within the computer housing, and the heat must ultimately be dissipated to the environment outside the computer case. Numerous patents have addressed these problems, but most of the cooling devices are very complex and difficult to manufacture so that there are significant possibilities for improvement.

Some of the prior art devices use heat sinks which are massive parts and which are impractical to use in a lap top computer. Others make no effort to move the heat away from a heat sink which is in contact with the integrated circuit chip. With the high powers now prevalent in computers, heat which is not removed can build up adjacent to the integrated circuit and can lead to high temperatures and damage to the integrated circuit chip.

Another approach which is used for desktop computers, is a miniature fan built right into the integrated circuit socket. Unfortunately, such fans are not only noisy, but they subject the equipment to reliability problems, since the typical miniature fan has a much shorter life expectancy than the typical integrated circuit. The problem is made more severe by the fact that a fan failure can cause the destruction of the integrated circuit for which it was providing cooling. Such failures are reminiscent of the battle lost for want of a horseshoe nail, since the fan costs only a few dollars while the integrated circuit costs hundreds of dollars.

SUMMARY OF THE INVENTION

The present invention provides an inexpensive but very effective solution for the cooling of integrated circuits in both desktop and laptop computers. To cool any integrated circuit, a simple heat pipe is attached directly to the integrated circuit, and another location of the heat pipe is attached to a wall of the casing or some other cooler location in the computer. It is the very simple means of attaching the heat pipe to the integrated circuit and the cooled surface which yields the particular benefit of the present invention.

Only three parts are involved in the invention. One part is, of course, the heat pipe. It is a simple cylindrical or near cylindrical heat pipe. A heat pipe is particularly well suited for moving heat away from the integrated circuit, since the heat generated by the integrated circuit is transferred to any cooler location. The evaporation and condensation cycle internal to the heat pipe moves the heat with virtually no temperature difference across the heat pipe. Therefore, a heat pipe attached to an integrated circuit and, for example, a cooled wall of a computer cabinet furnishes virtually the same cooling of the integrated circuit as would result from the integrated circuit being mounted directly on the cooled cabinet wall.

The second part of the invention is a simple heat spreading clamp similar in appearance to the type of clamp used to attach electrical conduit to a flat wall. The heat spreading clamp is constructed from a good heat conductive material such as copper or aluminum, it has a "U" section shaped to mate with the cylindrical surface of the heat pipe, and it has two flat flanges attached to the edges of the "U" section.

The third part of the invention is the attachment device. It is a piece of flat, heat conductive tape with heat conductive adhesive on both surfaces of the tape.

To install the heat pipe on an integrated circuit or any other surface it is only necessary to apply the heat conductive tape to the integrated circuit or other surface, and to press the heat pipe onto the tape with the heat pipe oriented so that the unattached exposed adhesive surface of the tape extends out from under the heat pipe. The heat spreading clamp is then fitted around the heat pipe so that their cylindrical surfaces mate, and the flanges of the heat spreading clamp are pressed against the exposed adhesive of the tape.

The heat pipe is thereby attached to an integrated circuit or other surface through a good heat conductive path, which consists of both the direct contact with the integrated circuit and the path through the heat spreading clamp, which is also attached to the integrated circuit. Moreover, a slight flattening of the heat pipe surface in contact with the integrated circuit can further enhance the thermal conductivity by increasing the surface area of direct contact. It should be appreciated that this same heat transferring attachment system can be used to attach a heat pipe to any cooled surface such as, for instance, a wall of the cabinet of the equipment or a finned heat sink at the end of the heat pipe remote from the integrated circuit.

The resulting thermal connection is so inexpensive to produce that there is no concern about destroying it when the occasional replacement of an integrated circuit may be necessary. If an integrated circuit is replaced, it is only necessary to pull the heat pipe and the heat spreading clamp off the tape, clean the surfaces and replace the old tape with a new piece before reassembly.

The present invention thereby furnishes a very simple structure which can remove the heat from an integrated circuit, and, by means of the heat pipe, move the heat to a location in the equipment from which it can easily be dissipated.

BRIEF DESCRIPTION OF THE DRAWINGS

The FIGURE is a perspective view of the preferred embodiment of the invention.

DETAILED DESCRIPTION OF THE INVENTION

The FIGURE is a perspective view of the preferred embodiment of the cooling structure 10 of the invention attached to an integrated circuit 12. Cooling structure 10 depends upon heat pipe 14 with one part 16 of heat pipe 14 attached to integrated circuit 12 by means of a connection with good thermal conductivity.

This attachment with good thermal conductivity is accomplished quite simply by using thermally conductive tape 18 which is coated on both its surfaces with a thermally conductive adhesive. This so called double faced tape is a commercially available product 0.005 inch thick designated as THERMATTACH T404 by its manufacturer Chrometrics, Inc. of Woburn, Mass. The thermal conductivity of tape 18, including the thermal conductivity of it adhesive, is rated by the manufacturer at 0.37 W/m-K.

The heat transfer between integrated circuit 12 and heat pipe 14 is further enhanced by the use of heat conducting clamp 20 which furnishes a parallel path for the conduction of heat from integrated circuit 12 to heat pipe 14. Heat conducting clamp 20 is constructed of a material with good heat conductivity, such as copper or aluminum, and formed with "U" section 22 to which are attached two flat flanges 24. "U" section 22 is shaped and sized to fit tightly around heat pipe 14 when flanges 24 are mounted flat upon integrated circuit 12. Heat conducting clamp 20 is made as long as is possible to maximize its contact surface with integrated circuit 12, although it need not be limited in length and can be installed so that flanges 24 overhang integrated circuit 12.

With double faced tape 18 attached to integrated circuit 12 and heat pipe 14 and heat conducting clamp 20 attached to double faced tape 18, heat conducting clamp 20 serves as a heat transfer path. Heat from integrated circuit 12 thus moves into flanges 24, along "U" section 22, and from "U" section 22 into heat pipe 14. This path has the advantage of much greater heat transfer surfaces between heat conducting clamp 20 and integrated circuit 12 and heat pipe 14 than the limited direct contact of cylindrical surface 26 of heat pipe 14 with integrated circuit 12.

However, in order to increase the heat transfer surface available at surface 26, heat pipe 14 can be flattened somewhat at its line of contact 26 with tape 18. Even a slight amount of flattening of the outside surface of heat pipe 14 at contact line 26 greatly increases the available heat transfer surface.

In the preferred embodiment of the invention shown, heat pipe 14 is constructed of copper tubing 3 mm in diameter, although it is quite practical to use tubing in the range of 3 mm to ¼ inch diameter. The tubing of the preferred embodiment has a wall thickness of 0.020 inch while the typical range of wall thicknesses can be 0.020 to 0.032 inch. The heat pipe of the preferred embodiment contains water as the vaporizable liquid. Flattened surface 26 of heat pipe 14 creates a flat surface which is approximately 2.5 mm wide for the original pipe diameter of 3 mm, and can, of course, vary in length for the particular application. Heat conductive clamp 20 is constructed of sheet aluminum 0.025 inch thick and can be 6 to 10 inches long. The dimension between the remote ends of flanges 24 varies with the application, but is typically in the range of ½ to 3 inches.

This preferred embodiment has transferred 8 watts from a one inch square heat source surface at a temperature of 70 degrees centigrade to ambient air at 40 degrees centigrade degrees with a temperature difference of only 5 degrees centigrade between the heat source and the cooler plate subjected to the air cooling.

End 26 of heat pipe 14 which is remote from part 16 can be attached to a cooled surface in the same manner as end 16 is attached to integrated circuit 12. In such an installation, heat pipe 14 is attached to cooled panel 28 such as the external case of the equipment by the use of second heat conducting clamp 21 and double faced heat conductive tape 19. As is well understood in the art of heat pipes the length of heat pipe 14 does not affect its effectiveness, and, as shown in the FIGURE, the orientation of the cooled surface is not critical.

The present invention therefore furnishes a simple and economical cooling system for integrated circuits, and furnishes the added benefits of high reliability, long life expectancy, and more effective cooling than is available from even a fan directly installed upon the integrated circuit socket.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example, other materials, heat pipe sizes, and types of tape and adhesives could be used. Furthermore, both ends of the heat pipe need not be attached by the double faced tape arrangement. Particularly, at the cooled surface, another, more conventional attachment means, could be used.

What is claimed as new and for which Letters patent of the United States are desired to be secured is:

1. An apparatus for removing heat from an integrated circuit comprising:

heat conductive tape with a first face and a second face, each coated with adhesive, the first face of which is attached to an integrated circuit;

a heat pipe attached to the second face of the heat conductive tape; and a heat conducting clamp formed with a "U" section and two flanges attached to the ends of the "U" section, with the "U" section fitted around and in contact with the heat pipe, and the flanges attached to the second face of the heat conductive tape.

2. The apparatus of claim 1 wherein the heat pipe is cylindrical.

3. The apparatus of claim 1 wherein the heat pipe has a flattened surface in contact with the tape.

4. An apparatus for transferring heat between a surface and a heat pipe comprising:

heat conductive tape with a first face and a second face, each coated with adhesive, the first face of which is attached to a surface;

a heat pipe one part of which is attached to the second face of the heat conductive tape; and a heat conducting clamp formed with a "U" section and two flanges attached to the ends of the "U" section, with the "U" section fitted around and in contact with the heat pipe, and the flanges attached to the second face of the heat conductive tape.

5. The apparatus of claim 4 wherein the heat pipe is cylindrical.

6. The apparatus of claim 4 wherein the heat pipe has a flattened surface in contact with the tape.

* * * * *